(12) United States Patent
Fackenthal et al.

(10) Patent No.: US 7,885,099 B2
(45) Date of Patent: Feb. 8, 2011

(54) ADAPTIVE WORDLINE PROGRAMMING BIAS OF A PHASE CHANGE MEMORY

(75) Inventors: Richard E. Fackenthal, Carmichael, CA (US); Ferdinando Bedeschi, Milan (IT); Meenatchi Jagasivamani, Fairfield, CA (US); Ravi Annavajjhala, Folsom, CA (US); Enzo M. Donze, Agrate Brianza (IT)

(73) Assignee: Intel Corporation, Santa Clara, CA (US)

( * ) Notice: Subject to any disclaimer, the term of this patent is extended or adjusted under 35 U.S.C. 154(b) by 395 days.

(21) Appl. No.: 11/901,493

(22) Filed: Sep. 18, 2007

(65) Prior Publication Data

US 2009/0073752 A1 Mar. 19, 2009

(51) Int. Cl.
*G11C 11/00* (2006.01)

(52) U.S. Cl. ........................ 365/163; 365/148; 977/754

(58) Field of Classification Search .................. 365/46, 365/94, 100, 113, 129, 148, 163; 257/2–5, 257/296, E31.047, E27.006; 438/29, 95, 438/96, 166, 259, 365, 482, 486, 597; 977/754
See application file for complete search history.

(56) References Cited

U.S. PATENT DOCUMENTS

| 7,408,810 | B2 * | 8/2008 | Aritome et al. | ........ 365/185.23 |
| 2003/0123284 | A1 * | 7/2003 | Lowrey et al. | .............. 365/175 |
| 2007/0195603 | A1 * | 8/2007 | Aritome et al. | ........ 365/185.23 |

* cited by examiner

*Primary Examiner*—Richard Elms
*Assistant Examiner*—Harry W Byrne
(74) *Attorney, Agent, or Firm*—Trop, Pruner & Hu, P.C.

(57) ABSTRACT

The leakage current and power consumption of phase change memories may be reduced using adaptive word line biasing. Depending on the particular voltage applied to the bitline of a programmed cell, the word lines of unselected cells may vary correspondingly. In some embodiments, the word line voltage may be caused to match the bitline voltage of the programmed cell.

7 Claims, 2 Drawing Sheets

ADAPTIVE WORDLINE PROGRAMMING BIAS OF A PHASE CHANGE MEMORY

BACKGROUND

This relates generally to phase change memories that use chalcogenide materials.

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

DETAILED DESCRIPTION

In connection with the programming of phase change memories, it is desirable to limit the conduction of unselected cells on unselected rows and columns. Conduction by these unselected cells is unnecessary and creates adverse consequences. For example, this conduction increases the power consumption of the overall memory. Given the fact that phase change memories can have a large number of cells, conduction by unselected cells may be a significant source of power consumption.

Generally, the amount of bias that needs to be applied to unselected cells to turn them off is a function of the bias supplied to the selected cells. In some cases, the bias applied to the selected cells may vary, for example, due to process variations. When this variation happens, it may be advantageous to vary the bias on the unselected cells.

In accordance with some embodiments, the bias on the unselected cells during programming may be varied to match the bias on the selected cells.

Figure 1:
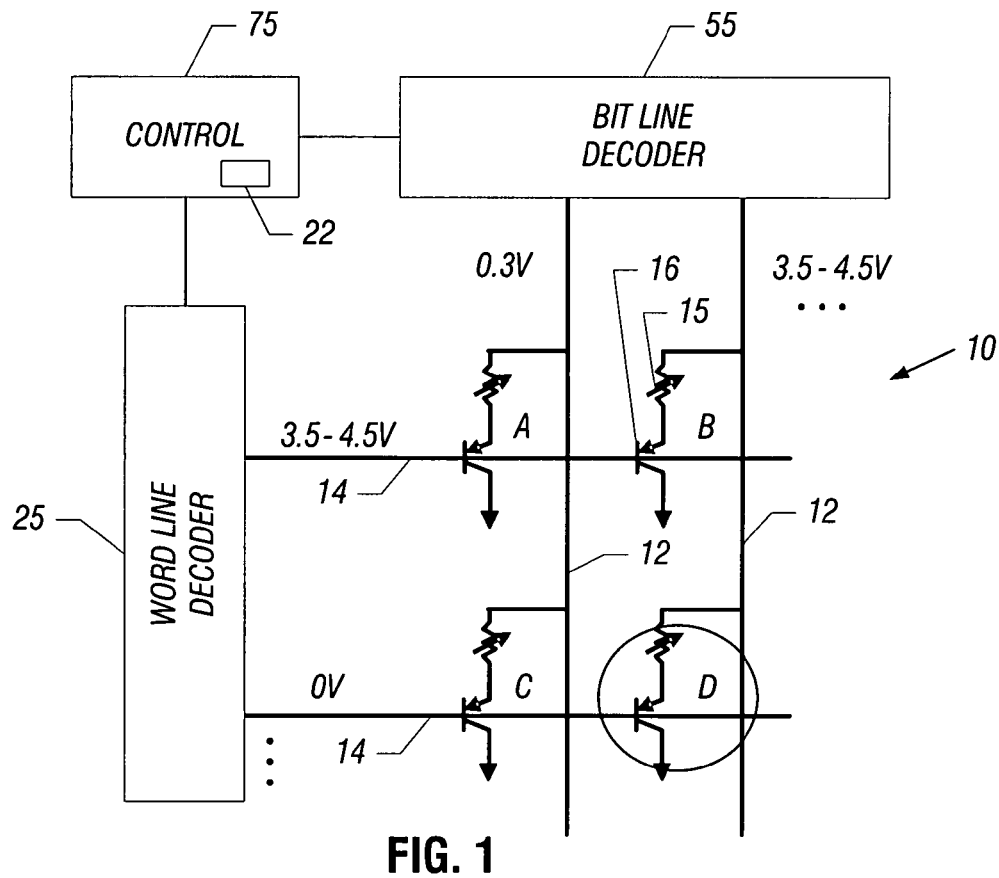
FIG. 1 is a circuit depiction of a phase change memory in accordance with one embodiment of the present invention.

In the embodiment shown in FIG. 1, each cell A, B, C, or D may include a phase change memory element 14 and a bipolar junction transistor 16. However, other embodiments are contemplated and the present invention is not limited to the specific cell design depicted.

Zero volts applied to the base of the bipolar junction transistors 16 for the selected word line allows the emitter base junction to forward bias, allowing programming current to pass through the memory element 14. The bitline 12 uses a relatively high voltage, in this case from 3.5 to 4.5 volts. This voltage may vary depending on the cell's behavior with respect to process induced variations. One cell may require, in this example, 3.5 volts, while another cell may require a bitline programming voltage of 4.5 volts and others may require something in between.

A portion of a phase change memory array 10 is depicted. The array 10 includes columns 12 and rows 14. In one embodiment, a word line or row bias of 3.5 to 4.5 volts is applied by a decoder 25 to the unselected cells A and B on an unselected row 14, while a bias of zero volts is applied to the row 14 including the selected cell D. At the same time, an unselected bitline 12 may have 0.3 volts applied by the bitline decoder 55, while the selected bitline or column line 12 may have 3.5 to 4.5 volts in this example. Of course, the voltages applied are completely hypothetical and the present invention is in no way limited to specific applied voltages.

However, it may be appreciated that if the selected cell D is exposed to a bitline bias varying from 3.5 to 4.5 volts, this may complicate the bias that needs to be applied to the unselected cells, such as the cells A and B in unselected rows. They too must received a word line bias that varies according to the bias applied to the bitline of the selected cell in order to turn them off. Thus, the unselected word line voltage is related to the selected bitline voltage and, therefore, may be adjusted according to the changes, from cell to cell, in the bitline programming voltage.

Figure 2:
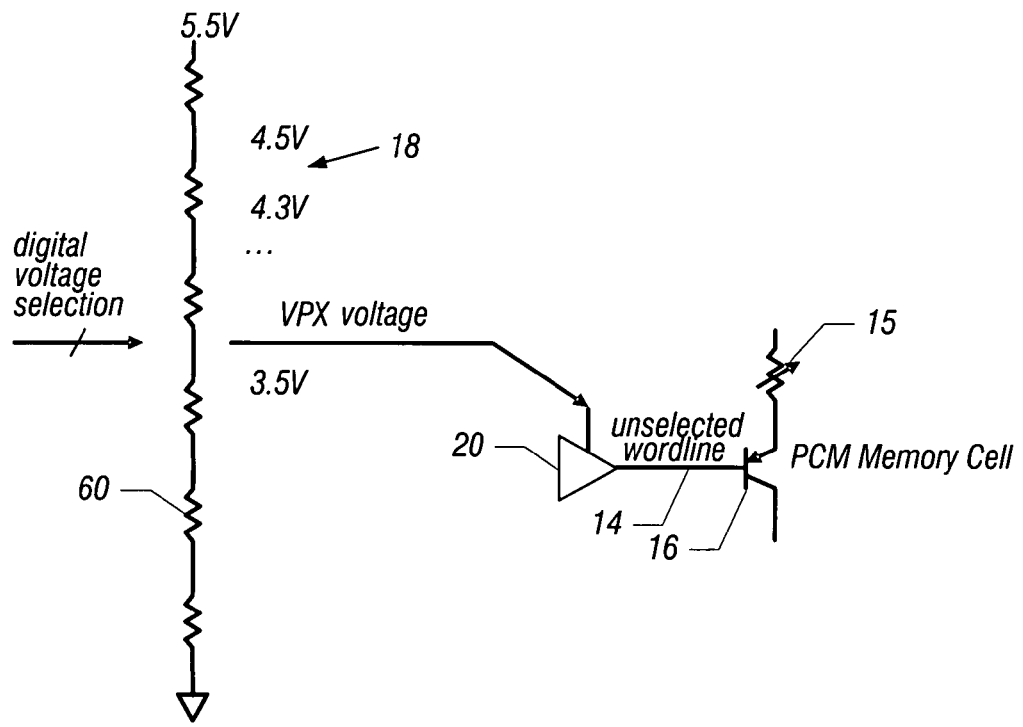
FIG. 2 is a depiction of a digital-to-analog converter for use with a phase change memory cell in accordance with one embodiment of the present invention.

Referring to FIG. 2, in accordance with one embodiment, the word line decoder 25 includes a digital-to-analog converter 18 coupled to the word lines 14. The digital-to-analog converter 18 may include a series of resistors 60 of different resistance values so that at nodes between the resistors 60, different output voltages, indicated as VPX, can be provided selectably. In other words, a digital voltage selection determines the output node. The voltage VPX from that output node is supplied to an amplifier 20 and then to the selected word line 14, and, finally, to the base of each bipolar junction transistor 16 in each cell A-D.

It may be desirable to have as low a leakage on the unselected cells as possible so that the unselected word lines have a bias equal to the bias on the selected bitlines during programming. In some embodiments, it may also be desirable to avoid over-programming the cells. In general, it is desirable to step the program voltage up in increments so that the cells which require lower voltages do not see the higher voltages.

Figure 3:
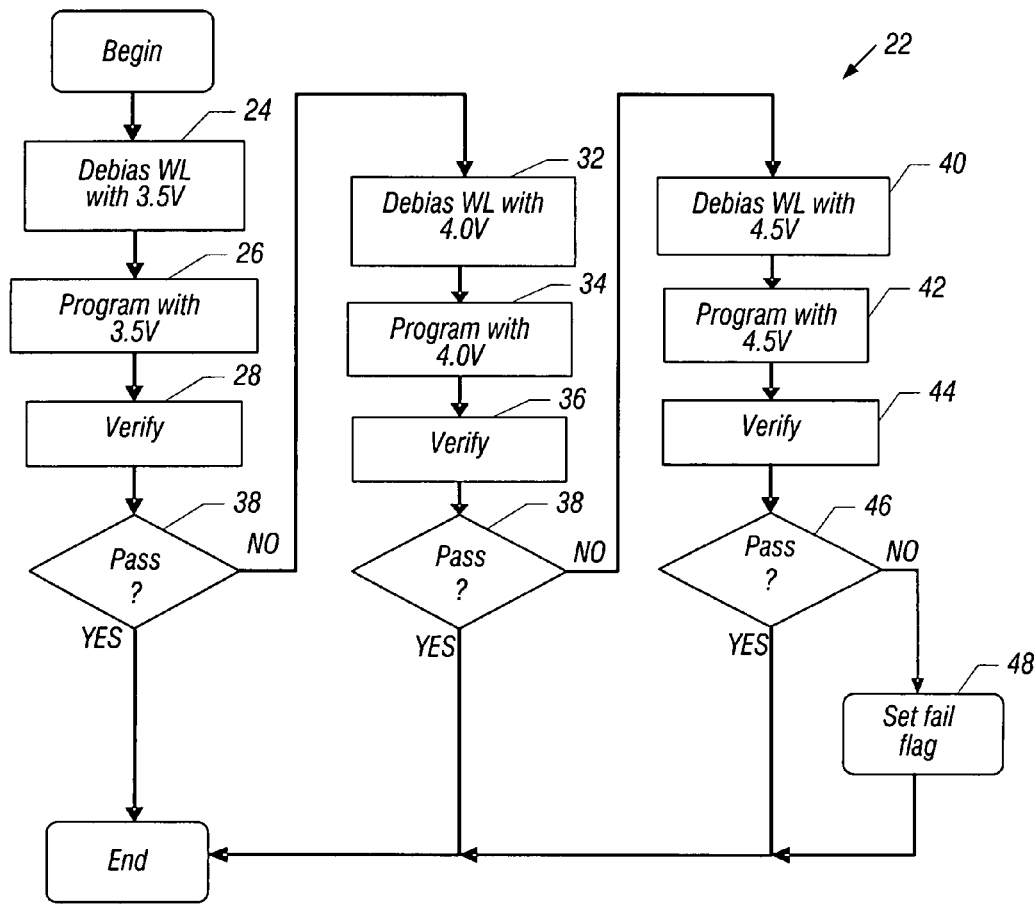
FIG. 3 is a flow diagram in accordance with one embodiment of the present invention.

An adaptive programming approach, shown in FIG. 3, causes the unselected word line bias to adapt the selected bitline bias. A voltage may "adapt to" another voltage without precisely matching or following the other voltage precisely by moving in the same direction as the other voltage. In some embodiments, the adaptive programming approach may be implemented by software stored in the control 75. The control 75 may be a controller with an internal storage in one embodiment. On a first pulse of N (e.g., where N=3), a lowest program voltage is applied, in this example 3.5 volts (block 26). The debias voltage follows with 3.5 volts (block 24). A verify is performed (block 28), and those cells which pass (diamond 38) do not see a further programming pulse (block 34). Cells which do not pass continue with the algorithm and see an elevated voltage (e.g., 4.0 volts) with the debias voltage following (block 32). Those that still do not pass see the highest voltage (e.g., 4.5) volts as the debias voltage on the word lines (block 40) and as the bitline programming voltage (block 42). In this example, where N is 3, three pulses are available, 3.5, 4.0, and 4.5 volts, but these numbers would be different for different designs, technologies, and architectures. If the cell still does not pass, it is failed (block 48).

It may be advantageous to avoid leaving the unselected or debiased word line voltage always at the highest level, shutting off the B cells. The disadvantage of doing this is that the cells A see a higher reverse bias voltage and, thereby, would leak more, impacting the background current consumption during programming. The A cells are important since the vast majority of the cells in the array are biased in this way. A small fraction of cells may require the highest voltage, so statistically it is not often that the third pulse will be applied at all. Since on each iteration the higher voltages are applied only for a fraction of the overall run time, the elevated voltage and, thus, the background leakage to the A cells contributes little to overall energy consumption.

Programming of a chalcogenide material within a cell to alter the state or phase of the material may be accomplished by generating a voltage potential across the memory element. When the voltage potential is greater than the threshold voltages of memory element, then an electrical current may flow through the chalcogenide material in response to the applied voltage potentials, and may result in heating of the chalcogenide material.

This heating may alter the memory state or phase of the chalcogenide material. Altering the phase or state of the chalcogenide material may alter the electrical characteristic of memory material, e.g., the resistance of the material may be altered by altering the phase of the memory material. Memory material may also be referred to as a programmable resistive material.

In the "reset" state, memory material may be in an amorphous or semi-amorphous state and in the "set" state, memory material may be in a crystalline or semi-crystalline state. Both "reset" and "set" states can exist without any energy (electrical, optical, mechanical) applied to bistable chalcogenide. The resistance of memory material in the amorphous or semi-amorphous state may be greater than the resistance of memory material in the crystalline or semi-crystalline state. It is to be appreciated that the association of reset and set with amorphous and crystalline states, respectively, is a convention and that at least an opposite convention may be adopted.

Using electrical current, memory material may be heated to a relatively higher temperature to amorphosize memory material and "reset" memory material (e.g., program memory material to a logic "0" value). Heating the volume of memory material to a relatively lower crystallization temperature may crystallize memory material and "set" memory material (e.g., program memory material to a logic "1" value). Various resistances of memory material may be achieved to store information by varying the amount of current flow and duration through the volume of memory material.

Figure 4:
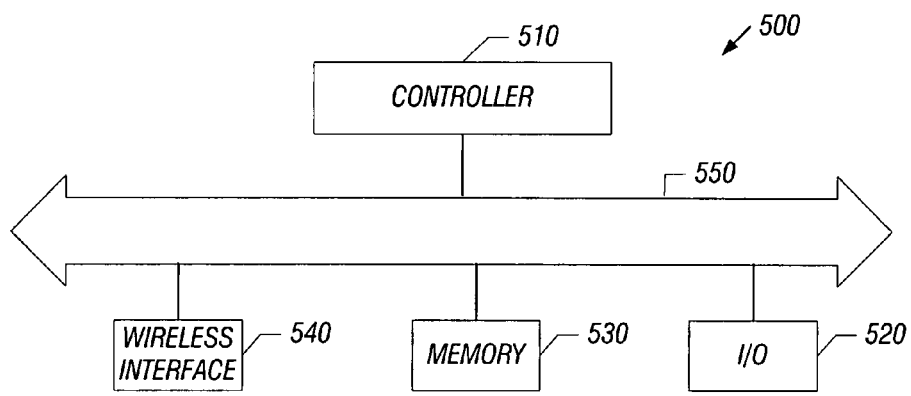
FIG. 4 is a system depiction in accordance with one embodiment of the present invention.

Turning to FIG. 4, a portion of a system 500 in accordance with an embodiment of the present invention is described. System 500 may be used in wireless or mobile devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 may include a controller 510, an input/output (I/O) device 520 (e.g. a keypad, display), static random access memory (SRAM) 560, a memory 530, and a wireless interface 540 coupled to each other via a bus 550. A battery 580 may be used in some embodiments. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory, a volatile memory, a non-volatile memory such as a flash memory and/or a memory such as memory discussed herein.

I/O device 520 may be used by a user to generate a message. System 500 may use wireless interface 540 to transmit and receive messages to and from a wireless communication network with a radio frequency (RF) signal. Examples of wireless interface 540 may include an antenna or a wireless transceiver, although the scope of the present invention is not limited in this respect.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
an array of phase change memory cells; and
a controller coupled to said array to cause a cell bias during programming of an unselected phase change memory cell to follow, by moving in the same direction, a cell bias applied to a selected phase change memory cell during programming.

2. The apparatus of claim 1 wherein said controller to cause a word line programming voltage of the unselected phase change memory cell to adapt to a voltage applied to a bitline of the selected phase change memory cell during programming.

3. The apparatus of claim 2, said controller to program with a first lower voltage and debias an unselected word line with said first lower voltage.

4. The apparatus of claim 3, said controller to program with a first higher voltage, higher than said first lower voltage, if the cell is not programmed by said first lower voltage.

5. The apparatus of claim 4, said controller to use the second higher voltage, higher than the first higher voltage, to program a cell not programmed by a said first higher voltage.

6. The apparatus of claim 1, said controller to increase the bias applied to an unselected phase change memory cell as the bias is increased to a selected phase change memory during programming.

7. An apparatus comprising:
an array of phase change memory cells; and
a controller coupled to said array to cause a cell bias during programming of an unselected phase change memory cell to adapt to a cell bias applied to a selected phase change memory cell during programming, including a digital-to-analog converter and a resistor array, said digital-to-analog converter to apply different word line debiasing voltages.

* * * * *